(12) United States Patent
Harvey

(10) Patent No.: US 6,229,394 B1
(45) Date of Patent: May 8, 2001

(54) CIRCUIT PROVIDING A NEGATIVE RESISTANCE TO OFFSET ERROR VOLTAGE FOR USE WITH A FOLDED CASCODE AMPLIFIER

(75) Inventor: Barry Harvey, Los Altos, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 0 days.

(21) Appl. No.: 09/398,261

(22) Filed: Sep. 17, 1999

(51) Int. Cl.[7] .................................................. H03F 3/45
(52) U.S. Cl. ............................................. 330/252; 330/257
(58) Field of Search .................................. 330/252, 257, 330/261

(56) References Cited

U.S. PATENT DOCUMENTS 4,600,893 * 7/1986 Sugimoto ............................ 330/252
5,168,243 12/1992 Feliz et al. ........................... 330/252

OTHER PUBLICATIONS

Toumazou, C., et al.,*Analogue IC design the current–mode approach*, IEE Circuits and Systems Series 2, pp. 70–81, 90, 91 (1990).

* cited by examiner

Primary Examiner—Steven J. Mottola
(74) Attorney, Agent, or Firm—Fliesler Dubb Meyer & Lovejoy LLP

(57) ABSTRACT

An offset error voltage cancellation circuit which may be used with a folded cascode amplifier. The folded cascode amplifier includes a differential amplifier having transistors (100) and (102) with collectors connected to a resistor (110) having a value ($R_1$) and a resistor (112) having a value ($R_2$), and transistors (120) and (122) for folding back current having emitters connected to the resistors (110) and (112). The error cancellation circuit includes resistors (210) and (212) having values ($R_1'$) and ($R_2'$) matching the respective values ($R_1$) and ($R_2$), along with cross coupled transistors (220) and (222) connecting the resistors (210) and (212) to the emitters of transistors (120) and (122). As connected, the cross coupled transistors (220) and (222) and resistors (210) and (212) effectively form a negative resistance $-(R_1+R_2)$ to cancel error voltage between the emitters of transistors (120) and (122). In an additional embodiment, the offset error correction circuit further includes transistors (320) and (322) which connect the cross coupled transistors (220) and (222) to the emitters of transistors (120) and (122) to prevent introduction of errors due to the impedance of transistors (220) and (222). In addition to folded cascode amplifiers, the offset error correction circuit can further be utilized with other circuits having common base transistors with emitters driving separate transistors.

11 Claims, 4 Drawing Sheets

CIRCUIT PROVIDING A NEGATIVE RESISTANCE TO OFFSET ERROR VOLTAGE FOR USE WITH A FOLDED CASCODE AMPLIFIER

BACKGROUND OF THE INVENTION

1. Field of the Invention

This invention relates to circuitry used to compensate for error currents generated by common base transistors due to the Early Effect. More particularly, this invention relates to such error compensation circuitry used with folded cascode amplifiers.

2. Description of the Related Art

FIG. 1 shows circuitry for a conventional folded cascode amplifier. As shown, the folded cascode amplifier includes a differential amplifier with first and second transistors 100 and 102. The base of transistor 100 receives an inverting input ($V_{IN-}$), while the base of transistor 102 receives a noninverting input ($V_{IN+}$). A current source 104 connects a positive power supply rail voltage (V+) to the emitters of transistors 100 and 102. The collector of transistor 100 is connected by a resistor 110 having a value $R_1$ to a negative power supply rail voltage (V−), while the collector of transistor 102 is connected by a resistor 112 having a value $R_2$ to the V− power supply rail.

The current developed by the differential amplifier is "folded" back to provide a current to comply with more positive signal swings at a gain node (G) using circuitry including third and fourth transistors 120 and 122 connected in a common base configuration. The gain node G is connected to the collector of transistor 122 and to the input of a buffer 126, the output of the buffer 126 forming the output $V_{OUT}$ of the amplifier. Transistor 120 has an emitter connected to the collector of transistor 102 and a collector connected to the input of a current mirror 124, while transistor 122 has an emitter connected to the collector of transistor 100 and a collector connected to the output of current mirror 124. The bases of transistors 120 and 122 are connected together through a voltage bias circuit 128 to the V− power supply rail.

Under ideal conditions, resistors 110 and 112 can be replaced with electronic current sinks. With electronic current sinks, differential signal currents from the collector of transistors 100 and 102 will travel through transistors 120 and 122 largely unmodified, insensitive to differing parameters in transistors 120 and 122. However, resistors 110 and 112 are typically used instead of the current sinks because the voltage swing at the inputs $V_{IN-}$ and $V_{IN+}$ will not be limited by a minimum operating voltage which an electronic current sink requires. When resistors 110 and 112 are utilized, the V− and V+ power supply rails may be designed to place as low as 150 mV across the resistors 110 and 112. Further, either of the inputs $V_{IN+}$ or $V_{IN-}$ can go all the way to the V− rail voltage and the amplifier still work properly.

With resistors 110 and 112 used instead of electronic current sinks, a difference between the collector to emitter voltages ($V_{CE}$S) of transistors 120 and 122 creates an offset voltage $V_{OS}$ across the inputs $V_{IN+}$ and $V_{IN-}$, requiring an unbalanced input voltage to correct. For transistor 120, almost the entire voltage potential difference between the V+ and V− rails is applied as its $V_{CE}$, while only about half of the potential difference between the V+ and V− rails is applied as the $V_{CE}$ of transistor 122. Such a difference in $V_{CE}$S occurs because the collector of transistor 122 is coupled to a the input of buffer 126 which has a nominal voltage value of 0 volts. The imbalance in the $V_{CE}$ voltages between common base transistors 120 and 122 causes a corresponding imbalance in the base to emitter voltage ($V_{BE}$) of transistors 120 and 122 due to the Early Effect. A difference in $V_{BE}$ voltages in transistors 120 and 122 places unbalanced voltages across resistors 110 and 112, generating an offset voltage $V_{OS}$ at the inputs $V_{IN-}$ and $V_{IN+}$. The offset $V_{OS}$ voltage can be represented as follows:

$$V_{OS}=vt\ln((V+-V_{OUT})/V_A)/R_N g_m$$

where vt is 26 mV at room temperature, $V_A$ is the Early Voltage of one of the respective transistors 120 or 122, $g_m$ is the transconductance of the respective transistor, and $R_N$ is the resistance of the resistor 110 or 112 connected to the respective transistor 120 or 122. The offset voltage $V_{OS}$ can be as much as a 10 mV.

With the offset voltage $V_{OS}$ as represented above, an overall gain reduction occurs for the amplifier due to the offset voltage $V_{OS}$ varying with the output voltage $V_{OUT}$. Further, thermal noise performance is degraded, being effectively amplified and referred from the emitters of transistors 120 and 122 to the inputs of the amplifier. With $V_{OS}$ further varying with the supply voltage, V+, attempts to trim $V_{OS}$ for particular transistor parameters will be thwarted.

U.S. Pat. No. 5,168,243 entitled "Integrated High Gain Amplifier" discloses circuitry for increasing gain in a folded cascode amplifier by limiting $V_{OS}$. The circuitry includes a current source driving cross coupled transistors connected to compensate for imbalance between transistors 120 and 122. The cross coupled transistors include a pair of transistors with a first transistor having a base coupled to the collector of a second transistor, and the second transistor having a base coupled to the collector of the first transistor. The current source feeds the emitters of the cross coupled transistors and is tuned to reduce any imbalance between transistors 120 and 122.

SUMMARY OF THE INVENTION

The present invention provides an improved method for cancellation of the error offset voltage $V_{OS}$ in a folded cascode amplifier.

The present invention includes circuitry which does not require tuning to cancel error offset voltage $V_{OS}$, as opposed to the circuitry described in U.S. Pat. No. 5,168,243.

The present invention further provides cancellation of the error offset voltage irrespective of temperature changes.

In accordance with the present invention, an error offset voltage cancellation circuit is provided including, referring to FIG. 2, resistors 210 and 212, a current source 214 connected to a first end of resistors 210 and 212, and cross coupled transistors 220 and 222 connecting second ends of resistors 210 and 212 to the emitters of transistors 120 and 122. The resistors 210 and 212 have resistance values $R_1'$ and $R_2'$ matching the respective values $R_1$ and $R_2$. As connected, the cross coupled transistors 220 and 222 and resistors 210 and 212 effectively form a negative resistance −($R_1$+$R_2$) to cancel error voltage between the emitters of transistors 120 and 122.

Because the resistors 210 and 212 have values $R_1'$ and $R_2'$ matching the values $R_1$ and $R_2$ of resistors 110 and 112 enabling cancellation of an offset voltage, no tuning is required. Further, with temperature changes, any changes in resistance values 110 and 112 will be matched by a similar change in the resistance value of resistors 210 and 212. Retuning will, thus, not be required with changes in temperature.

In an additional embodiment, referring to FIG. 3, the present invention includes transistors 320 and 322 which connect the cross coupled transistors 220 and 222 to the resistors 110 and 112. Transistors 320 and 322 serve to compensate for any output offset errors due to the added impedance of transistors 220 and 222.

In addition to use with common base transistors 120 and 122 of a folded cascode amplifier, the negative resistance circuits shown in FIGS. 2 and 3 can serve to eliminate offset error voltage in other circuits which include common base transistors driving two separate resistors, as illustrated in FIGS. 4 and 5.

BRIEF DESCRIPTION OF THE DRAWINGS

Further details of the present invention are explained with the help of the attached drawings in which.

DETAILED DESCRIPTION

Figure 2:
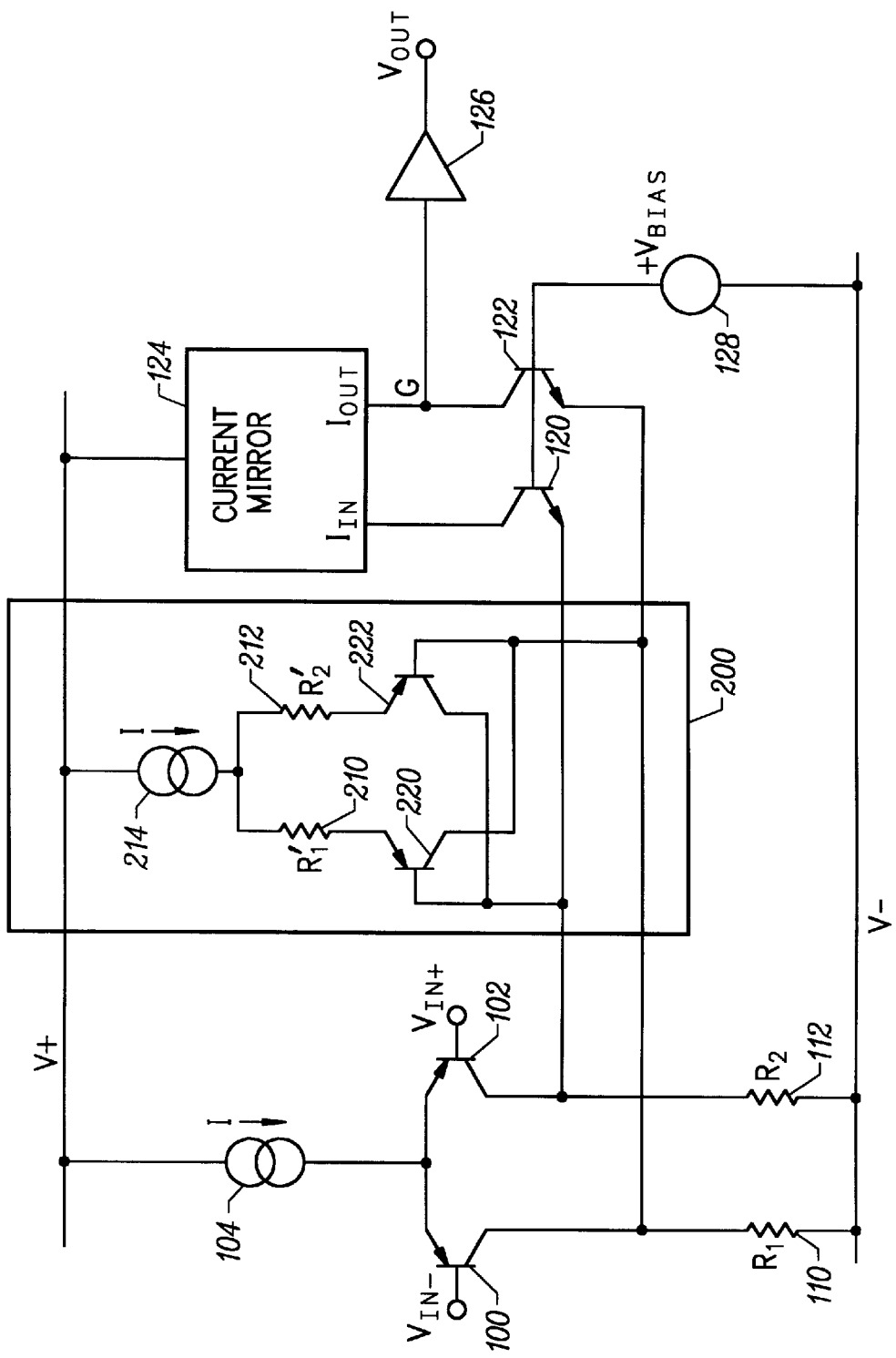
FIG. 2 illustrates an offset error correction circuit in accordance with the present invention used with a folded cascode amplifier.

FIG. 2 shows an offset error cancellation circuit 200 in accordance with the present invention as used with a folded cascode amplifier. The circuit 200 includes a resistor 210 having a resistance value $R_1'$ and a resistor 210 having a resistance value $R_2'$. The value $R_1'$ is set to match the resistance $R_1$ of the resistor 110, while the value $R_2'$ is set to match the resistance $R_2$ of the resistor 112. A first terminal of resistors 210 and 212 is connected through a current source 214 to the power supply rail V+.

Figure 1:
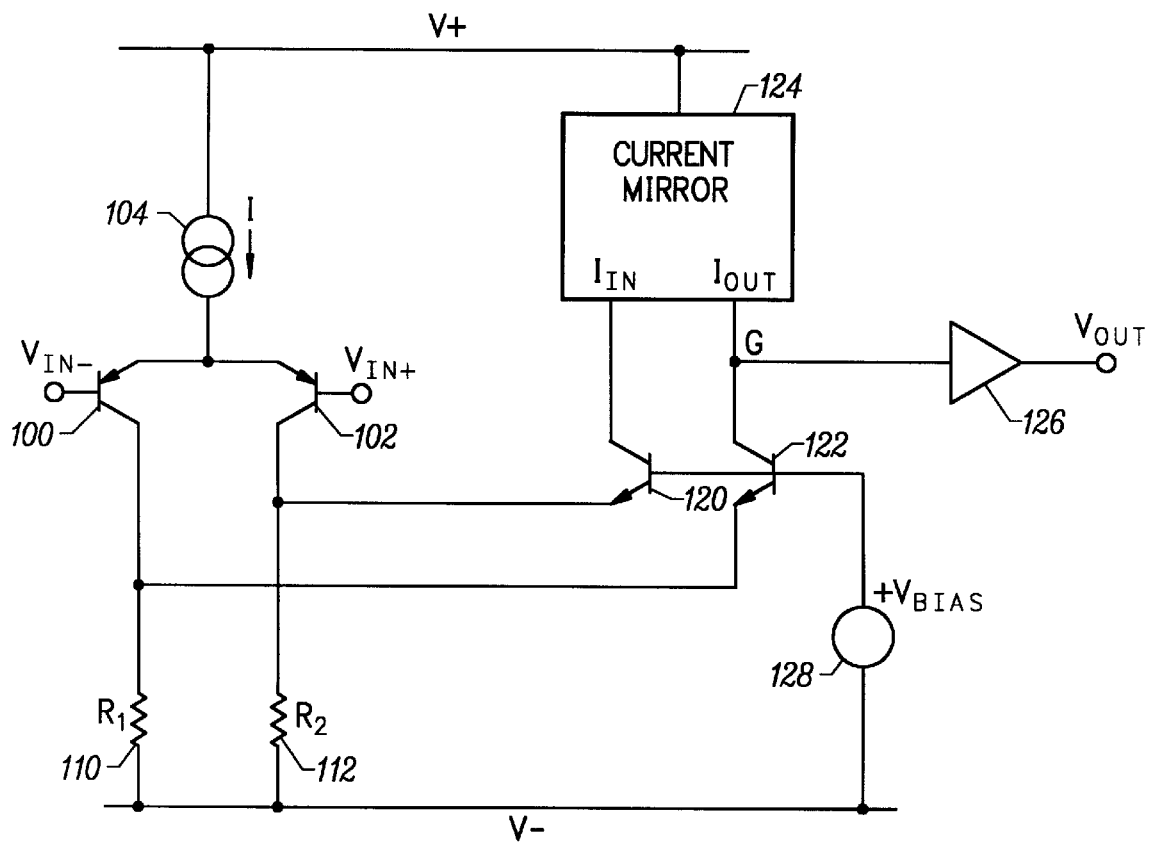
FIG. 1 shows circuitry for a conventional folded cascode amplifier.

The offset error cancellation circuit 200 further includes transistors 220 and 222. The emitter of transistor 220 is connected to a second terminal of resistor 210, while the emitter of transistor 222 is connected to a second terminal of resistor 212. The base of transistor 220 and the collector of transistor 222 are connected to the emitter of transistor 120, while the base of transistor 222 and the collector of transistor 220 are connected to the emitter of transistor 122. Note that components carried over from FIG. 1 are similarly labeled in FIG. 2, as will be components carried over in subsequent drawings.

As connected, the components of the circuit 200 form a differential amplifier with an output of approximately $V_{DIFF}/(R_1+R_2)$, where $V_{DIFF}$ is the voltage difference from the emitter of transistor 120 to the emitter of transistor 122. The collectors of transistors 220 and 222 are crossed so that current flow runs backward from the sense of applied differential voltage $V_{DIFF}$. The differential impedance is then approximately $-(R_1+R_2)$, and the common mode impedance is as high as that of the current source 214.

With the negative resistance $-(R_1+R_2)$ provided by the circuit 200 applied across the emitters of transistors 120 and 122, any mismatch voltage $\Delta V_{BE}$ between the emitters of transistors 120 and 122 induces a current difference $\Delta V_{BE}/(R_1+R_2)$ through resistors 110 and 112 and also a current difference $-\Delta V_{BE}/(R_1'+R_2')$ through resistors 210 and 212, which cancels any error.

The accuracy of the circuit of FIG. 2, however, is limited. The emitter impedance of the transistors 220 and 222 is in series with the resistance of the respective resistors 210 and 212. Further, the emitter impedance of transistors 220 and 222 varies with the current supplied by current source 214 and with temperature.

Figure 3:
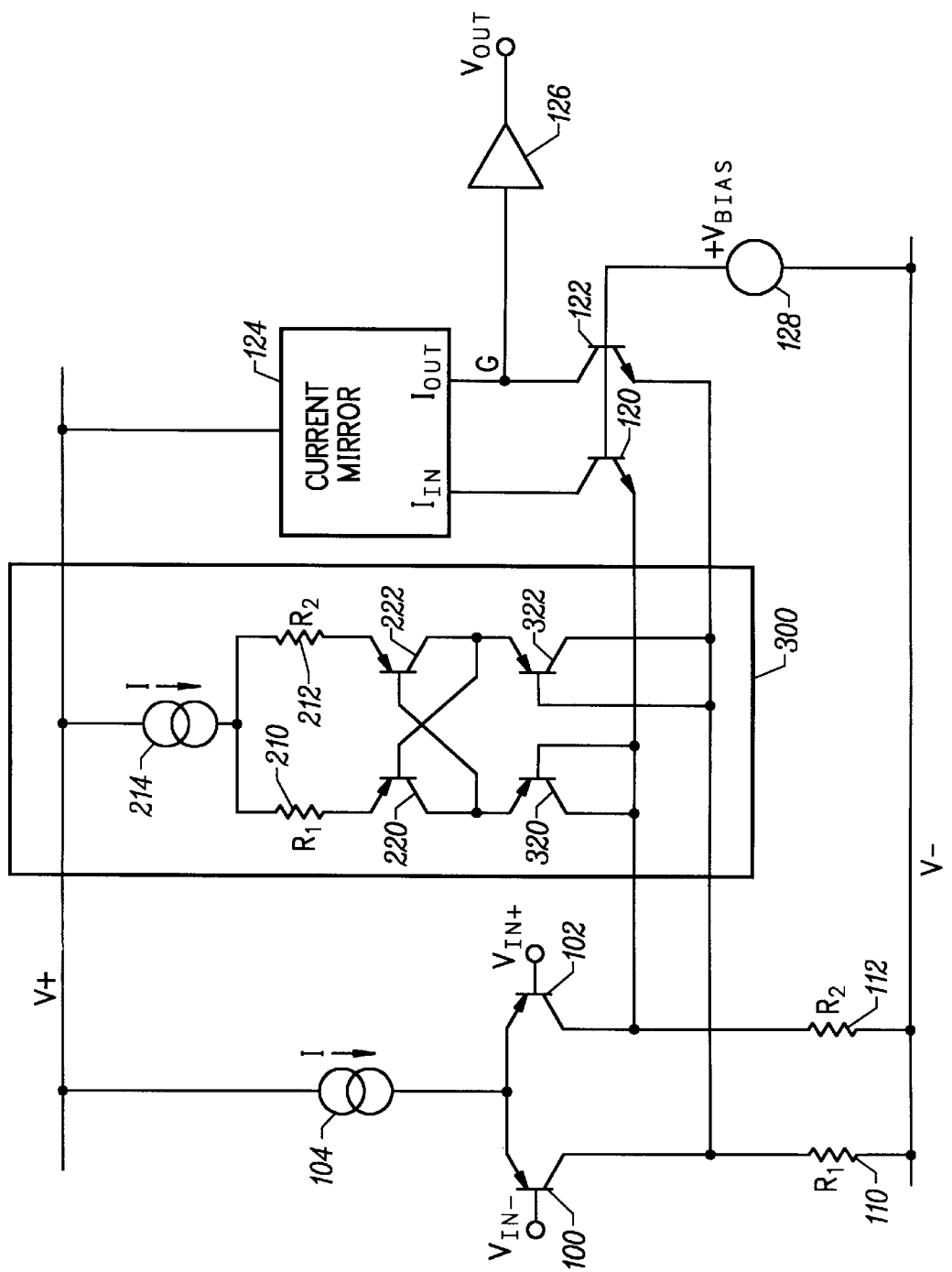
FIG. 3 illustrates an additional embodiment of the offset error correction circuit in accordance with the present invention used with a folded cascode amplifier.

FIG. 3 illustrates an additional embodiment of the present invention wherein compensation is provided for the impedance in transistors 220 and 222 used in the error correction circuit of FIG. 2 without introducing errors due to changes in current levels or temperature. The offset error correction circuit 300 of FIG. 3 modifies the circuit 200 of FIG. 2 by adding a transistor 320 to connect the collector of transistor 220 and base of transistor 222 to the emitter of transistor 120. Further, a transistor 322 is added to connect the collector of transistor 222 and base of transistor 220 to the emitter of transistor 122.

Transistors 220, 222, 320 and 322 are connected to form a cross coupled quad. The emitter of transistor 320 is connected to the collector of transistor 220, while the base and collector of transistor 320 are connected to the emitter of transistor 120. The emitter of transistor 322 is connected to the collector of transistor 222, while the base and collector of transistor 322 are connected to the emitter of transistor 122.

Because the transistors 220 and 222 are cross coupled, the effect of the emitter impedance of transistors 220 and 222 is canceled by the effect of the emitter impedance of transistors 320 and 322. Thus, the transistors 220, 222, 320 and 322 do not introduce any impedance between resistors 210 and 212 and the emitters of transistors 120 and 122. Further, because the effect of any emitter impedance of transistors 220 and 222 is canceled by transistors 320 and 322, operation will independent of temperature and changes in current from the current source 214.

Figure 4:
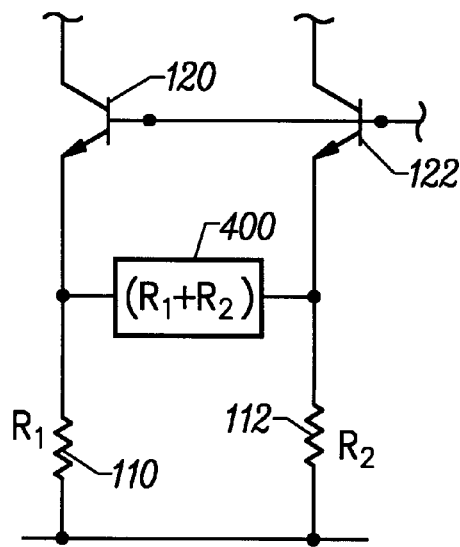
FIG. 4 illustrates that the offset error correction circuit in accordance with the present invention can be used with any common base transistors with emitters driving resistors.

Although the offset error correction circuit shown in FIGS. 2 and 3 is connected to a folded cascode amplifier circuit, such an offset error correction circuit can be used with any common base transistors with emitters driving separate resistors, as shown in FIG. 4. In FIG. 4, the common base of transistors 120 and 122 are connectable to any arbitrary circuit, and their emitters are similarly connectable to any arbitrary circuit. The emitters of transistors 120 and 122 are connected by respective resistors 110 and 112 to a voltage rail. The offset error correction circuit 400 connecting the emitters of transistors 120 and 122 then generates a negative resistance equal to the sum of the value of resistors 110 and 112, $-(R1+R2)$. The negative resistance of circuit 400 will serve to cancel any offset voltage. Circuitry for the offset error correction circuit 300 may include the components of either circuit 200 of FIG. 2, or circuit 300 of FIG. 3.

Figure 5:
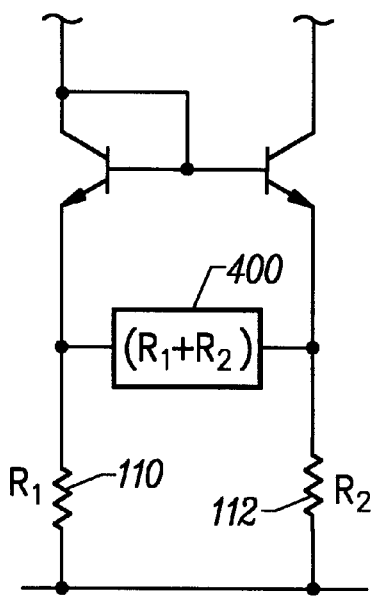
FIG. 5 illustrates an offset error correction circuit in accordance with the present invention as used with common base transistors connected in a current mirror configuration.

FIG. 5 shows the components of FIG. 4 with the common base transistors 120 and 122 connected in a current mirror configuration. For a current mirror configuration, the common bases of transistors 120 and 122 are connected to the collector of transistor 120. The offset error correction circuit 400 will still function to correct for any voltage offset across resistors 110 and 112 caused by differences the transistors 120 and 122. Although not specifically shown, the offset error correction circuit as connected in FIG. 4 can also be used in conjunction with any number of other circuits in accordance with the present invention.

Although the invention has been described above with particularity, this was merely to teach one of ordinary skill in the art how to make and use the invention. Many additional modifications will fall within the scope of the invention, as that scope is defined by the claims which follow.

What is claimed is:

1. A circuit comprising:
   a first transistor having a base, and an emitter;
   a second transistor having a base connected to the base of the first transistor and an emitter;
   a first resistor having a first terminal coupled to the emitter of the first transistor and having a second terminal coupled to a first voltage potential (V−);
   a second resistor having a first terminal coupled to the emitter of the second transistor and having a second terminal coupled to the first voltage potential (V−);
   a third resistor having a first terminal and a second terminal, the second terminal being coupled to a second voltage potential (V+);
   a fourth resistor having a first terminal and a second terminal, the second terminal being coupled to the second voltage potential (V+);
   a third transistor having a collector to emitter path coupling a first terminal of the third resistor to the first terminal of the second resistor, and having a base coupled to the first terminal of the first resistor; and
   a fourth transistor having a collector to emitter path coupling the first terminal of the fourth resistor to the first terminal of the first resistor, and having a base coupled to the first terminal of the second resistor.

2. The circuit of claim 1, wherein the first resistor has a resistance value substantially equal to the third resistor and the second resistor has a resistance value substantially equal to the fourth resistor.

3. The circuit of claim 2, further comprising:
   a fifth transistor having a collector to emitter path coupling the collector to emitter path of the third transistor to the first terminal of the second resistor, and having a base coupled to the first terminal of the second resistor; and
   an sixth transistor having a collector to emitter path coupling the collector to emitter path of the fourth transistor to the first terminal of the first resistor, and having a base coupled to the first terminal of the first resistor.

4. The circuit of claim 1, further comprising:
   a current source coupling the second terminal of each of the third resistor and fourth resistor to the second voltage potential (V+).

5. A folded cascode amplifier comprising:
   a differential amplifier including a first transistor and a second transistor, each having a base providing a differential input;
   a first resistor having a first terminal coupled to a collector to emitter path of the first transistor of the differential amplifier and a second terminal coupled to a second voltage potential (V−);
   a second resistor having a first terminal coupled to the collector to emitter path of the second transistor of the differential amplifier and a second terminal coupled to the second voltage potential (V−);
   a current mirror;
   a third transistor having a collector to emitter path coupling the first terminal of the second resistor to an input of the current mirror;
   a fourth transistor having a collector to emitter path coupling the first terminal of the first resistor to an output of the current mirror;
   a third resistor having a first terminal and a second terminal, the second terminal being coupled to a first voltage potential (V+);
   a fourth resistor having a first terminal and a second terminal, the second terminal being coupled to the first voltage potential (V+);
   a fifth transistor having a collector to emitter path coupling a first terminal of the third resistor to the first terminal of the second resistor, and having a base coupled to the first terminal of the first resistor; and
   a sixth transistor having a collector to emitter path coupling the first terminal of the fourth resistor to the first terminal of the first resistor, and having a base coupled to the first terminal of the second resistor.

6. The folded cascode amplifier of claim 5, wherein the first resistor has a resistance value substantially equal to the third resistor and the second resistor has a resistance value substantially equal to the fourth resistor.

7. The folded cascode amplifier of claim 6, further comprising:
   a seventh transistor having a collector to emitter path coupling the collector to emitter path of the fifth transistor to the first terminal of the second resistor, and having a base coupled to the first terminal of the second resistor; and
   an eighth transistor having a collector to emitter path coupling the collector to emitter path of the sixth transistor to the first terminal of the first resistor, and having a base coupled to the first terminal of the first resistor.

8. The folded cascode amplifier of claim 5, further comprising:
   a current source coupling the second terminal of each of the third resistor and fourth resistor to the first voltage potential (V+).

9. A folded cascode amplifier comprising:
   a differential amplifier including a first transistor and a second transistor, each having a base providing a differential input, an emitter connected by a first current source to a first voltage potential (V+), and a collector;
   a first resistor having a first terminal connected to the collector of the first transistor of the differential amplifier and a second terminal connected to a second voltage potential (V−);
   a second resistor having a first terminal connected to the collector of the second transistor of the differential amplifier and a second terminal connected to the second voltage potential (V−);
   a current mirror having an input and an output, the output being connected to a gain node and to the input of a buffer, wherein the buffer output provides an output of the folded cascode amplifier;
   a third transistor having a collector connected to the input of the current mirror, an emitter connected to the first terminal of the second resistor, and a base connected to a bias voltage;
   a fourth transistor having a collector connected to the output of the current mirror, an emitter connected to the first terminal of the first resistor, and a base connected to the bias voltage;
   a third resistor having a first terminal and a second terminal, the second terminal connected by a second current source to the first voltage potential (V+);
   a fourth resistor having a first terminal and a second terminal, the second terminal connected by the second current source to the first voltage potential;

a fifth transistor having an emitter connected to the first terminal of the third resistor, and having a collector and a base; and a sixth transistor having an emitter connected to the first terminal of the fourth resistor, and having a collector and a base:

a seventh transistor having an emitter connected to the collector of the firth transistor and to the base of the sixth transistor, and a collector and base both connected to the first terminal of the second resistor; and an eighth transistor having an emitter connected to the collector of the sixth transistor and to the base of the fifth transistor, and a collector and base both connected to the first terminal of the first resistor.

10. The folded cascode amplifier of claim 9, wherein the first resistor has a resistance value substantially equal to the third resistor and the second resistor has a resistance value substantially equal to the fourth resistor.

11. The folded cascode amplifier of claim 9, further comprising:

a current source coupling the second terminal of each of the third resistor and fourth resistor to the first voltage potential (V+).

* * * * *